United States Patent
Kitazawa et al.

(10) Patent No.: US 6,178,623 B1
(45) Date of Patent: *Jan. 30, 2001

(54) COMPOSITE LIGHTWEIGHT COPPER PLATED ALUMINUM WIRE

(75) Inventors: hiroshi Kitazawa; tatsuo Yamaguchi, both of Ueda; etsuro Tsukada, Toubu-machi, all of (JP)

(73) Assignee: Totoku Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/164,490

(22) Filed: Oct. 1, 1998

(30) Foreign Application Priority Data

Dec. 16, 1997 (JP) ................................. 9-363573

(51) Int. Cl.[7] ............................................ H01R 43/00
(52) U.S. Cl. ........................ 29/825; 156/47; 205/176; 205/181
(58) Field of Search ................ 174/36, 102 A, 174/106 R, 102 R; 29/825, 826; 205/176, 181; 156/47

(56) References Cited

U.S. PATENT DOCUMENTS

| 3,274,021 | * | 9/1966 | Jongkind et al. | 117/130 |
|---|---|---|---|---|
| 3,800,405 | * | 4/1974 | Ziemek | 29/473.9 |
| 3,881,999 | * | 5/1975 | Toth et al. | 204/33 |
| 3,915,667 | * | 10/1975 | Ricks | 29/197 |
| 4,855,335 | * | 8/1989 | Neperud | 523/111 |

* cited by examiner

Primary Examiner—Carl J. Arbes
(74) Attorney, Agent, or Firm—Jordan and Hamburg LLP

(57) ABSTRACT

A copper plated aluminum wire with improvement in adhesive properties is fabricated by a method which includes a displacement step of forming a thin layer of a metal by displacement on a surface of an aluminum or aluminum alloy conductor, an electroplating step of coating a surface of the thin layer continuously with copper layers by electroplating to have a copper coated aluminum conductor, and a thermal diffusion step of heat treating the copper coated aluminum conductor at a temperature of 120° C. to 600° C. under an inert gas atmosphere for thermal diffusion. A plated aluminum wire is provided having an anchor metal layer formed by displacement plating, a low thermally conductive metal layer formed by electroplating, and a high electrically conductive metal layer formed by electroplating in which all of the layers are sequentially deposited on an outer surface of an aluminum or aluminum alloy conductor. A plated aluminum wire is provided having an anchor metal layer formed by displacement plating and a high electrically conductive metal layer formed by electroplating in which both of the layers are sequentially deposited on an outer surface of an aluminum or aluminum alloy conductor. A composite lightweight copper plated wire is provided having an electrically conductive metal layer that is deposited by electroplating on an outer surface of an anchor metal layer provided on an aluminum conductor.

6 Claims, 9 Drawing Sheets

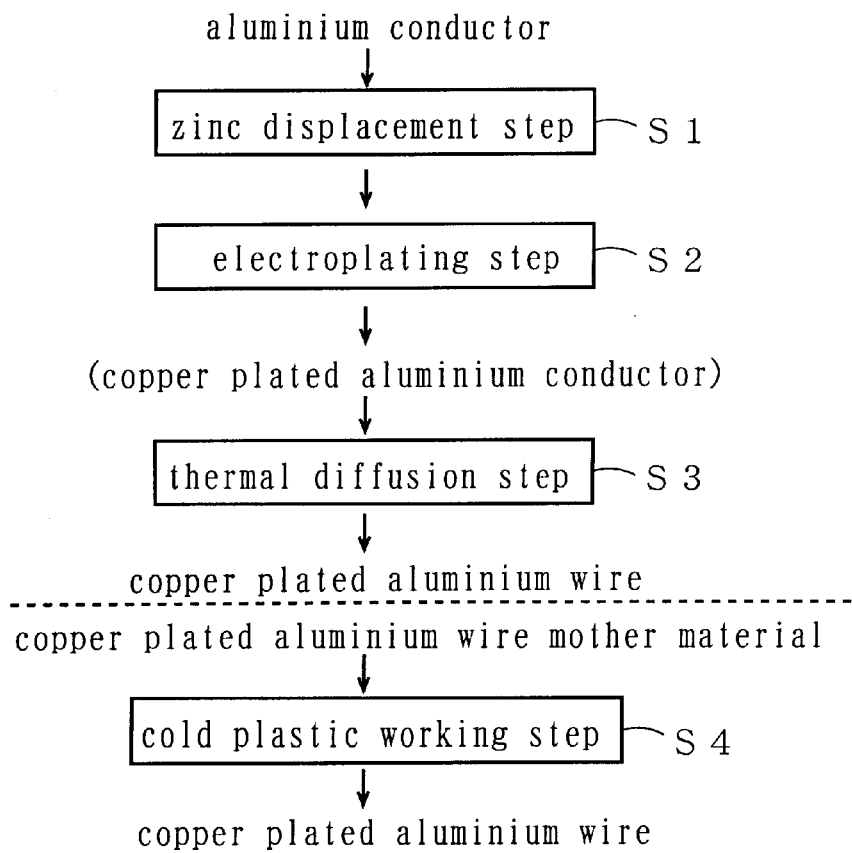
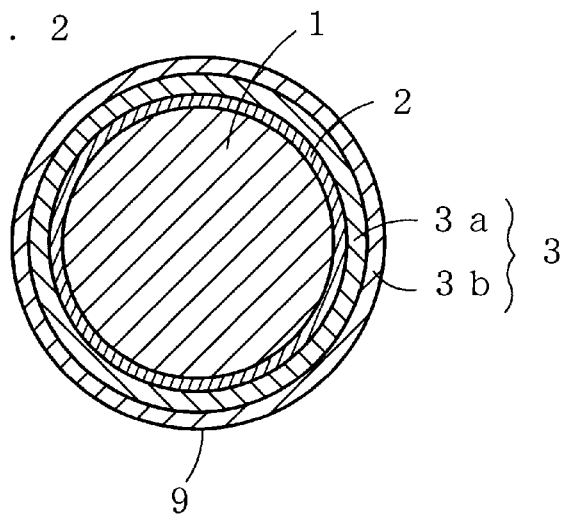

COMPOSITE LIGHTWEIGHT COPPER PLATED ALUMINUM WIRE

BACKGROUND OF THE INVENTION

1. Field of the Invention

The present invention relates to a method of fabricating copper plated aluminum wire and, particularly, to a method of fabricating copper plated aluminum wire in which a copper plated layer interfaced with an aluminum conductor is thermally diffused and has an improvement in adhesive properties.

The present invention relates to a plated aluminum wire, an insulating plated wire, and method of fabricating thereof. More specifically, the present invention relates to a plated aluminum wire and an insulating plated aluminum wire for use as wiring materials in an electronic device component, such as a coil, and to a method of fabricating said wires.

The present invention relates to a composite lightweight plated aluminum wire and, particularly, to a composite lightweight plated aluminum wire in which aluminum or aluminum alloy is employed as a main conductor and is used as a wiring material, such as a coil, in an electronic device.

2. Description of the Prior Art

As electronic devices and electronic components have been reduced in weight and size, their conductors, such as coils, have a smaller diameter. Also, to satisfy the demand for decreasing their weight, the conductors are selected from aluminum conductors or aluminum alloys (referred to as aluminum conductors hereinafter) of which specific gravity is substantially one-third or less that of copper. However, such aluminum conductors have electric potentials that are electrochemically unfavorable. When a metal surface of the conductor that was newly produced, e.g. by wire drawing, is exposed to air, an oxide layer is developed instantly on the surface so as to make the soldering difficult. The aluminum conductor itself has low mechanical strength and requires a particular joining technique for providing a desired degree of reliability on each joint.

Considering that the soldering of the aluminum conductors for joining is troublesome, copper-clad aluminum wires are now marketed as easily solderable, lightweight wires which are fabricated by providing a copper pipe cladding over the surface of an aluminum conductor by welding a tape of copper and drawing them to a length.

However, the copper-clad aluminum wire, when being drawn to have a desired small diameter, may often produce disconnections due to a poor adhesion at the interface between the aluminum conductor and the copper cladding.

It is also known that a plating process is favorably used for providing a higher adhesion between the aluminum conductor and the copper coat. In that case, the process of developing a closely plate coating over the surface of the aluminum conductor may be a conventional zincating technique by which a coat of zinc or zinc alloy (referred to as a zinc coat hereinafter) is tightly produced on the surface of the conductor. When the zinc coat is plated directly with a copper, a resultant copper plated aluminum wire has an improved copper plated layer.

However, during the cold plastic working process with dies, the wire is drawn several times. The adhesion at the interface between the aluminum conductor and the copper layer produced by plating is not so high. In case that its diameter is less than 0.15 mm, the copper plated aluminum wire may frequently produce disconnections.

As electronic devices have been reduced in size and weight, the demand for decreasing the weight of wiring materials, such as coils, installed in the electronic devices is increased. For satisfying the demand, simple drawn wires fabricated by copper conductors are replaced with specific copper-clad aluminum wires (referred to as copper-clad aluminum wires hereinafter) in which a coat of copper is provided on the surface of a mother material or an aluminum core (referred to as an aluminum core hereinafter) of a low density.

However, such copper-clad aluminum wires produced by the known manner are fabricated by welding a copper tape which is thus required to have a considerable thickness. This accordingly limits the increase of a ratio of cross-sectional area of the aluminum core in relation to an entire cross-sectional area of the copper clad aluminum wire for minimizing the overall weight. The maximum ratio for fabrication may be limited to about 85%. Therefore, further decrease of the weight will be difficult.

In the soldering step, the copper-clad aluminum wire of a minimal diameter (for example, 0.10 mm or less) undergoes a high degree of heat (e.g. 380° C.) and may be disconnected by thermal diffusion.

When aluminum conductors are employed as wire materials in an electronic device and intended to join to corresponding terminals of the device, they have to be treated by dissolving and removing oxide layers from their surface with a heated alkali solution, neutralized using an acid, rinsed with hot water, and subjected to ultrasonic cleaning before aluminum soldering such that their joining process to the terminals will not be easy. Also, the aluminum conductors have low mechanical strength and thus, require a specific technique for ensuring the reliability of joining strength at each joint.

To overcome the difficulty of joining the aluminum conductors to the terminals, copper-clad aluminum wires are fabricated by welding a copper tape over the surface of an aluminum conductor to form a copper pipe cladding, which is slightly greater in specific gravity than the aluminum conductor, and by drawing them and marketing them as solderable, lightweight wires.

The disadvantage is that when the copper-clad aluminum wires having the copper pipe cladding provided over the surface of the aluminum conductor are decreased to a desired small diameter by drawing, they may often be disconnected due to a poor joining strength at the interface between the aluminum conductor and the copper cladding.

It is known that a plating method is preferably used for improving the adhesion at the interface between an aluminum conductor and a copper cladding. In that case, a known zincating technique may be employed for forming a plating layer directly over the surface of the aluminum conductor. A resultant layer of zinc or zinc alloy is tightly bonded to the surface. However, during the electric plating conducted directly on the zinc layer produced by the zincating technique and when the plated layer is electrically connected and immersed in a solution, the zinc layer may be susceptible to significant dissolution on the acidic side of the solution. This causes portions of the aluminum conductor to be exposed and also, of a resultant plating copper layer to have a decline in the quality by chemical displacement. This decline thus results in breakage in the drawing process.

For compensation, electroless nickel plating is conducted before the zinc plating. However, a resultant nickel plating layer has unfavorable physical properties, such as 2% of the elongation and not less than 500 Hv of Vickers hardness, and low extensibility. Accordingly, in the drawing process, the plating layer may produce lateral flaws. Also, where the electroless plating produces a plating layer which is high in extensibility and easily drawn, its speed of deposition is on the order of 3 micrometers/hour thus declining the working efficiency.

SUMMARY OF THE INVENTION

The present invention is intended to solve the foregoing disadvantages of the prior art and its object is to provide a method of fabricating a copper plated aluminum wire which is easily treated by cold plastic working process so that the wire can have a smaller diameter and is highly adhesive.

The present invention is intended to solve the foregoing disadvantages of the prior art and its object is to provide a plated aluminum wire or an insulating plated aluminum wire which is reduced in weight and prevented from disconnection due to thermal diffusion, and to provide a method of fabricating the same.

The present invention is intended to solve the foregoing disadvantages of the prior art and its object is to provide a plated aluminum wire or an insulating plated aluminum wire which is reduced in weight, and to provide a method of fabricating the same.

The present invention is intended to solve the foregoing disadvantages of the prior art and its object is to provide a composite lightweight plated aluminum wire in which the zinc or zinc alloy layer developed on an aluminum conductor is electroplated under a particular condition to deposit an electrically conductive metal layer on its surface so that the adhesion between the aluminum conductor and the electrically conductive metal layer is increased. This allows the aluminum wire to be easily treated by plastic working, to have a smaller diameter at higher efficiency, and to have improved reliability at soldering joints.

According to a first feature of the present invention, a method of fabricating a copper plated aluminum wire comprises a zinc displacement step F1 of forming a zinc thin layer by zinc displacement on the surface of an aluminum or aluminum alloy conductor (referred to as an aluminum conductor hereinafter), an electroplating step F2 of coating the surface of the zinc thin layer continuously with copper layers by electroplating to have a copper coated aluminum conductor, and a thermal diffusion step F3 of heat treating the copper coated aluminum conductor at a temperature of 120° C. to 600° C. under an inert gas atmosphere for thermal diffusion to ease the electrodeposition stress, whereby the adhesion on the resultant copper plated aluminum wire will be improved.

In the method of the first feature of the present invention, the thermal diffusion step F3 provides heat treatment of the copper plated aluminum conductor at the temperature of 120° C. to 600° C. under the inert gas atmosphere to cause thermal diffusion and thus ease the electrodeposition stress. As a result, a thermal diffusion layer is developed at the interface between the aluminum conductor and the copper plating layer and a combination of the adhesion provided by the electroplating and the adhesion provided by the thermal diffusion will work effectively. Thus, the copper plated aluminum wire has an improvement in adhesive properties.

The electroplating for continuously forming the copper layers may comprise strike copper plating of depositing a strike copper plating layer and then copper sulfate plating of depositing a thick copper plating layer.

The temperature for heat treatment is set to a range from 120° C. to 600° C. because the thermal diffusion layer at the interface between the aluminum conductor and the copper plating layer is hardly developed at less than 120° C. If the copper plating layer is deposited too thick at over 600° C. due to instantaneous thermal diffusion, the thermal diffusion layer will be brittle.

According to a second feature of the present invention, the method of fabricating a copper plated aluminum wire is specified in which the thermal diffusion step allows the temperature T (°C.) and the time S (minute) for thermal treatment to be defined by the following Statement (1):

$$50\exp\{-0.012T\} \leq S \leq 1400\exp\{-0.012T\} \tag{1}$$

where $120 \leq T \leq 600$.

In the method of the second feature of the present invention, the temperature T (°C.) and the time T (minute) for thermal diffusion are defined by Statement (1) thus allowing the thermal diffusion layer to be favorably developed at the interface between the aluminum conductor and the copper plating layer. Therefore, as the adhesive properties in combination provided by the first feature is further enhanced, the copper plated aluminum wire will have an improvement in adhesive properties. This minimizes the probability of disconnection on particularly the wire of a smaller diameter (for example, less than 0.10 mm) during the cold plastic working process such as wire drawing.

The above Statement (1) was obtained through a series of experiments over the relation between the temperature and the time for the thermal treatment. FIG. 3 illustrates a graph of Statement (1) where the vertical axis (of logarithm) represents the time S (minute) and the horizontal axis represents the temperature T (°C.), and where the range of Statement (1) is expressed by the hatching area.

According to a third feature of the present invention, the method of fabricating a copper plated aluminum wire is specified in which the aluminum conductor defined by the first feature and the second feature has a diameter of less than 1.0 mm and is selected from 99.0% or higher pure drawing aluminum, an alloy of 90.0% or higher pure drawing aluminum-magnesium (Al—Mg), and an alloy of 90.0% or higher pure drawing aluminum magnesium-silicon (Al—Mg—Si).

In the method of the third feature of the present invention, the copper plated aluminum wire is fabricated favorably with the aluminum conductor having a diameter of less than 1.0 mm, and is selected from drawing aluminum, Al—Mg alloy, and Al—Mg—Si alloy.

According to a fourth feature of the present invention, the method of fabricating a copper plated aluminum wire is specified and further comprises a cold plastic working step of cold plastic working the copper plated aluminum wire defined by the first feature, the second feature and the third feature and used as a mother material to have a desired size.

In the method of the fourth feature of the present invention, the cold plastic working process, such as wire drawing, allows a desired size or particularly, a smaller diameter (for example, less than 0.10 mm) of the copper plated aluminum wire to be fabricated with a minimum of disconnections.

According to a fifth feature of the present invention, a plated aluminum wire comprises an anchor metal layer by displacement plating, a low thermally conductive metal layer by electroplating, and a high electrically conductive metal layer by electroplating in which all of the layers are sequentially deposited on an outer surface of an aluminum or aluminum alloy conductor.

The plated aluminum wire of the fifth feature of the present invention has on the outer surface of the aluminum conductor a succession of the anchor metal layer by displacement plating, the low thermally conductive metal layer by electroplating, and the high electrically conductive metal layer by electroplating. The low thermally conductive metal layer deposited between the anchor metal layer and the high electrically conductive metal layer prevents thermal diffusion.

Even when the plated aluminum wire of the present invention has a smaller diameter (for example, less than 0.10 mm), its low thermally conductive metal layer attenuates the effect of high heat (e.g. 380° C.) generated during the soldering process and will eliminate disconnection caused by thermal diffusion.

According to a sixth feature of the present invention, a plated aluminum wire is specified in which the ratio of cross-sectional area of the aluminum or aluminum alloy conductor to the cross-sectional area of the aluminum wire is at least 85%.

As the ratio of cross-sectional area of the aluminum or aluminum alloy conductor to the cross-sectional area of the plated aluminum wire of the sixth feature of the present invention is higher than 85%, the overall weight of the plated aluminum wire will be decreased.

According to a seventh feature of the present invention, a plated aluminum wire is specified in which the anchor metal layer is made of a metal selected from zinc, nickel, copper, gold, silver, and their alloys.

The anchor metal layer in the plated aluminum wire of the seventh feature of the present invention is made of a metal selected from zinc, nickel, copper, gold, silver, and their alloys and thus favorable as the anchor layer of the plated aluminum wire.

According to an eighth feature of the present invention, a plated aluminum wire is specified in which the low thermally conductive metal layer is made of a metal selected from nickel, chrome, iron, palladium, and platinum, of which thermal conductivity is less than 95 W/m k at a temperature of 20° C.

The low thermally conductive metal layer in the plated aluminum wire of the eighth feature of the present invention is made of a metal selected from nickel, chrome, iron, palladium, and platinum, of which thermal conductivity is less than 95 W/m k at a temperature of 20° C., such that disconnection caused by thermal diffusion is minimal. If the thermal conductivity exceeds 95 W/m k, the prevention of thermal diffusion will unfortunately be declined.

According to a ninth feature of the present invention, a plated aluminum wire is specified in which the high electrically conductive metal layer is made of a metal selected from copper, gold, silver, nickel, solder, and their alloys.

The high electrically conductive metal layer in the plated aluminum wire of the ninth feature of the present invention is made of a metal selected from copper, gold, silver, nickel, solder, and their alloys, and is favorable as the electrically conductive metal layer.

According to a tenth feature of the present invention, an insulating plated aluminum wire is specified further having an insulating coating on the outer surface of the plated aluminum wire.

Since the insulating plated aluminum wire of the tenth feature of the present invention has the insulating coating on the outer surface of the prescribed plated aluminum wire, it may successfully be used in a wound form such as a coil.

According to an eleventh feature of the present invention, a method of fabricating the plated aluminum wire comprises a degreasing step of removing oil from the surface of the aluminum or aluminum alloy conductor, an oxide layer removing step of removing a natural oxide layer, an anchor metal forming step of depositing the anchor metal layer by displacement plating over the aluminum or aluminum alloy conductor, a low thermally conductive metal layer forming step of depositing the low thermally conductive metal layer by electroplating over the anchor metal layer, a high electrically conductive metal layer forming step of depositing the high electrically conductive metal layer by electroplating over the low thermally conductive metal layer so as to complete a plated aluminum wire mother material, and a wire drawing step of drawing the plated aluminum wire mother material to a plated aluminum wire having a desired diameter.

In the method of fabricating the plated aluminum wire according to the eleventh feature of the present invention, the pre-plating steps, the displacement plating step of depositing the anchor metal layer by displacement plating, the low thermally conductive metal layer forming step of depositing the low thermally conductive metal layer by electroplating, and the high electrically conductive metal layer forming step of depositing the high electrically conductive metal layer by electroplating are carried out in combination to a plated aluminum wire. Each of the low thermally conductive metal layer and the high electrically conductive metal layer, such as a copper layer, can be deposited to a desired thickness by controlling the electroplating condition. Hence, as the ratio of cross-sectional area of the aluminum conductor to the cross-sectional area of the plated aluminum wire is easily set to 85% or higher, the overall weight of the plated aluminum wire will be decreased.

The method of the present invention also removes the natural oxide layer from the surface of the aluminum conductor and activates the surface which can thus be shifted to a desired metal surface by displacement plating using the potential difference. Consequently, the low thermally conductive metal layer and the high electrically conductive metal layer which have higher adhesiveness will successfully be deposited by the electroplating.

According to a twelfth feature of the present invention, a method of fabricating the insulating plated aluminum wire is specified and further comprises an insulating layer forming step of, after the wire drawing step, applying and baking a coating of insulating varnish to the outer surface of the plated aluminum wire to complete the insulating plated aluminum wire.

In the method of fabricating the insulating plated aluminum wire of the twelfth feature of the present invention, the insulating plated aluminum wire can easily be formed by the insulating layer forming step of applying and baking a coating of insulating varnish to the outer surface of the plated aluminum wire of a predetermined diameter defined by the eleventh feature.

According to a thirteenth feature of the present invention, a plated aluminum wire is specified and comprises an anchor metal layer by displacement plating, and a high electrically conductive metal layer by electroplating in which all of the layers are sequentially deposited on the outer surface of an aluminum or aluminum alloy conductor and in which the ratio of the cross-sectional area of the aluminum or aluminum alloy conductor to the cross-sectional area of the plated aluminum wire is higher than 85%.

Since the plated aluminum wire of the thirteenth feature of the present invention has the anchor metal layer by displacement plating, and the high electrically conductive metal layer by electroplating in which all of the layers are sequentially deposited on the outer surface of an aluminum conductor, its high electrically conductive metal layer can be deposited to a smaller thickness.

As the ratio of the cross-sectional area of the aluminum or aluminum alloy conductor to the cross-sectional area of the plated aluminum wire increases above 85 %, the overall weight of the plated aluminum wire of said thirteenth feature of the present invention will be minimized.

According to a fourteenth feature of the present invention, a plated aluminum wire is specified in which the anchor metal layer is made of a metal selected from zinc, nickel, copper, gold, silver, and their alloys.

Since its anchor metal layer is made of a metal selected from zinc, nickel, copper, gold, silver, and their alloys, the plated aluminum wire of the fourteenth feature of the present invention is favorably fabricated.

According to a fifteenth feature of the present invention, a plated aluminum wire is specified in which the high electrically conductive metal layer is made of a metal selected from copper, gold, silver, nickel, solder, and their alloys.

Since its high electrically conductive metal layer is made of a metal selected from copper, gold, silver, nickel, solder, and their alloys, the plated aluminum wire of the fifteenth feature of the present invention is favorably fabricated.

According to a sixteenth feature of the present invention, an insulating plated aluminum wire is specified having an insulating coating on the outer surface of the prescribed plated aluminum wire.

As its insulating coating is deposited on the outer surface of the plated aluminum wire, the insulating plated aluminum wire of the sixteenth feature of the present invention may successfully be used in a wound form such as a coil.

According to an seventeenth feature of the present invention, a method of fabricating the plated aluminum wire is specified and comprises a degreasing step of removing oil from the surface of the aluminum or aluminum alloy conductor, an oxide layer removing step of removing a natural oxide layer, an anchor metal forming step of depositing the anchor metal layer by displacement plating over the aluminum or aluminum alloy conductor, a high electrically conductive metal layer forming step of depositing the high electrically conductive metal layer by electroplating over the anchor metal layer so as to complete a plated aluminum wire mother material, and a wire drawing step of drawing the plated aluminum wire mother material to a plated aluminum wire having a desired diameter.

In the method of fabricating the plated aluminum wire of the seventeenth feature of the present invention, the pre-plating steps, the displacement plating step of depositing the anchor metal layer by displacement plating, and the high electrically conductive metal layer forming step of depositing the high electrically conductive metal layer by electroplating are carried out in a sequence to yield the plated aluminum wire. Each of the low thermally conductive metal layer and the high electrically conductive metal layer, such as a copper layer, can be deposited to a desired thickness by controlling the electroplating condition. Hence, as the ratio of the cross-sectional area of the aluminum conductor to the cross-sectional area of the plated aluminum wire is easily set to at least 85%, the overall weight of the plated aluminum wire will be decreased.

The method of the present invention also removes the natural oxide layer from the surface of the aluminum conductor and activates the surface which can thus be shifted to a desired metal surface by displacement plating using the potential difference. Consequently, the high electrically conductive metal layer, which has higher adhesive properties, will successfully be deposited by the electroplating.

According to a eighteenth feature of the present invention, a method of fabricating the insulating plated aluminum wire is specified and further comprises an insulating layer forming step of, after the wire drawing step, applying and baking a coating of insulating varnish to the outer surface of the plated aluminum wire to complete the insulating plated aluminum wire.

In the method of fabricating the insulating plated aluminum wire of the eighteenth feature of the present invention, the insulating plated aluminum wire can easily be formed by the insulating layer forming step of applying and baking a coating of insulating varnish to the outer surface of the plated aluminum wire of a predetermined diameter defined by the sixteenth feature.

According to a nineteenth feature of the present invention, a composite lightweight plated wire is specified and comprises an electrically conductive metal layer, which has a potential equal to or higher than that of zinc, that is deposited by electroplating on the outer surface of an anchor metal layer of zinc or zinc alloy (referred to as a zinc anchor metal layer hereinafter) provided on an aluminum or aluminum alloy conductor (referred to as an aluminum conductor). The electroplating is carried out under a condition where the concentration of hydrogen ion in an electrolyte solution is higher than 4 (pH) as an electrolysis parameter and the plating thickness x (micrometer) is $0.2 < x \leq 5$.

The aluminum conductor may be an industrial aluminum material having a purity of higher than 99.0% Al or an aluminum alloy having an aluminum concentration of higher than 90% Al. Also, the diameter d (mm) of the aluminum conductor may preferably be less than 0.25 mm or more preferably, $0.08 \leq d \leq 0.20$. If the electrically conductive metal layer has a thickness of more than 5 (micrometer), the decrease in weight will be offset.

The electrically conductive metal layers may be made of a material selected from zinc, iron, nickel, copper, silver, gold, and their alloys.

The electrolyte solution having a hydrogen ion concentration of higher than 4 (pH) may be selected from copper cyanide plating bath (pH 12), copper pyrophosphate plating bath (pH 8.5), nickel sulfate plating bath (pH 5.5), Watt nickel plating bath (pH 4.5), nickel aminosulfonate plating bath (pH 4.5), zinc cyanide plating bath (pH 12), lead zincate plating bath (pH 13), and gold cyanide plating bath (pH 12).

As the composite lightweight plated wire of the nineteenth feature of the present invention is fabricated, its electrically conductive metal layer is deposited on the surface of the zinc anchor metal layer located on the aluminum conductor by the electroplating in which the hydrogen ion concentration in the electrolyte solution is higher than 4 (pH) as the electrolysis parameter and the plating thickness x (micrometer) is defined by $0.2 \leq x \leq 5$. Since the dissolution and the chemical displacement of zinc are attenuated, the resultant plating layer will have an improvement in adhesive properties. Also, the electrically conductive metal layer minimizes the effect of natural oxidation hence contributing to the easy soldering on the composite lightweight plated wire.

The plating thickness x (micrometer) is set to $0.2 \leq x \leq 5$ because a thickness of smaller than 0.2 micrometer produces pits due to pin-hole effect and causes the surface of the layer to be coarse and to have dimples. If the thickness exceeds 5 micrometers, the energizing time takes 10 minutes or more (depending on the cathode current density).

According to a twentieth feature of the present invention, a composite lightweight plated wire is specified and further comprises a secondary electrically conductive metal layer, which has a potential equal to or higher than that of zinc, that is deposited by electroplating on the surface of the electrically conductive metal layer. The electroplating is carried out under a condition where the plating thickness y (micrometer) is 2.0<y≦40.

The diameter d (mm) of the aluminum conductor may be smaller than 1.00 mm and preferably, defined by 0.10≦d≦0.90. If the electrically conductive metal layer has a thickness of more than y (micrometer), the decrease in weight will be offset. If the diameter d (mm) is higher than 1.00 mm, the plating thickness after the wire drawing is decreased such that the reliability of soldering work is lowered. If the diameter d (mm) is smaller than 0.10, the overall weight will hardly be decreased.

As the composite lightweight plated wire of the twentieth feature of the present invention is fabricated, its second electrically conductive metal layer 4 is deposited on the surface of the electrically conductive metal layer (a first electrically conductive metal layer) by the electroplating in which the plating thickness y (micrometer) is defined by 0.2<x≦40. As a result, the composite lightweight plated wire will have an improvement in the reliability of soldering work.

The plating thickness y (micrometer) is set to 0.2<x≦40 because a thickness of more than 40 micrometers interrupts the decrease of weight.

According to a twenty-first feature of the present invention, a composite lightweight plated wire is specified in which the zinc anchor metal layer is retained 80% or higher.

The method of estimating which proportion of the zinc anchor metal layer is retained may be carried out using e.g. an atomic absorption spectroscopy meter. It comprises, after deposition of the zinc anchor metal layer on the aluminum conductor, removing the anchor metal layer with the use of nitric acid, quantitatively measuring the amount of zinc anchor metal per unit area (the result is estimated as 100%), depositing the zinc anchor metal layer, the electrically conductive layers, removing the metal layers using nitric acid, quantitatively measuring the zinc anchor metal per unit area, and comparatively estimating the remaining amount of the zinc anchor metal layer.

As its zinc metal layer is retained higher than 80%, the composite lightweight plated wire of the twenty-first feature of the present invention has an improvement in adhesive properties between the aluminum conductor and the electrically conductive metal layer such that the probability of disconnection during the wire drawing process is minimal.

According to a twenty-second feature of the present invention, a composite lightweight plated wire is specified in which a hot or cold plastic working process is applied to have a desired size of the composite light weighted plated wire.

It is also possible to have a heat treatment at 200° C. for five minutes prior to the hot or cold plastic working process in order to ease the stress distortion.

As the adhesion between its layers defined by the nineteenth to twenty-first features is improved, the composite lightweight plated wire of the twenty-second feature of the present invention can easily be formed to a desired size by the hot or cold plastic working process and will be minimized in the overall weight.

The aluminum conductor used in the plated aluminum wire of the present invention may consist mainly of Si ranging from 0.2% to 0.6%, Fe 0.35% or less, Cu 0.10% or less, Mn 0.10% or less, Mg ranging from 0.45% to 0.9%, Cr 0.10% or less, Zn 0.10% or less, Ti 0.10% or less, and Al of the remaining.

The aluminum conductor used in the plated aluminum wire of the present invention may consist mainly of Si 0.2% or less, Fe 0.20% or less, Cu 0.02% or less, Mn ranging from 0.05% to 0.13%, Mg ranging from 4.70% to 5.50%, Cr ranging from 0.05% to 0.13%, Zn 0.10% or less, Ti 0.10% or less, and Al of the remaining.

The aluminum conductor used in the plated aluminum wire of the present invention may consist mainly of Si 0.2% or less, Fe 0.2% or less, Cu ranging from 2.2% to 5.0%, Mn 0.15% or less, Mg 1.0% or less, Cr 0.10% or less, Zn 0.10% or less, Ti 0.10% or less, and Al of the remaining.

BRIEF DESCRIPTION OF THE DRAWINGS

FIG. 1 is a flowchart of assembling an embodiment of a copper plated aluminum wire according to the present invention;

FIG. 2 is a cross sectional view of an embodiment of a copper plated aluminum wire according to the present invention;

DETAILED DESCRIPTION OF THE INVENTION

Figure 3:
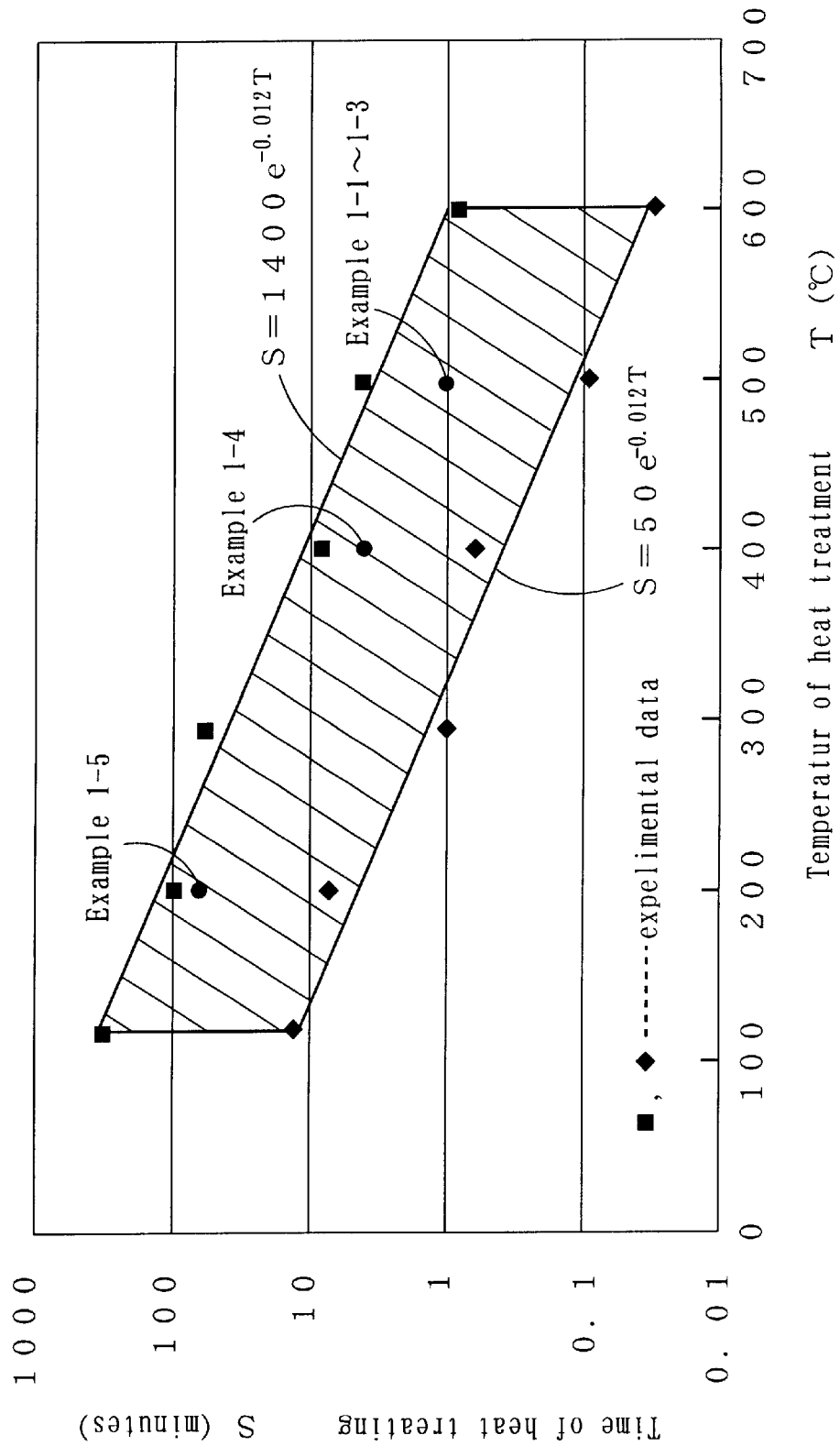
FIG. 3 is a graphic diagram showing Statement (1) of the present invention.

The present invention will be described in more detail referring to the embodiments shown in the accompanying drawings. It would be understood that the present invention is not limited to the illustrated embodiments.

FIG. 1 is a flowchart of assembling an embodiment of a copper plated aluminum wire according to the present invention. FIG. 2 is a cross sectional view of an embodiment of a copper plated aluminum wire according to the present invention.

Shown in the drawings are an aluminum conductor 1, a zinc thin layer 2, a copper coating 3, a strike copper plating layer 3a, a thick copper plating layer 3b, and a copper plated aluminum wire 9.

Example 1-1

The method started with a zinc displacement step S1 of forming a zinc thin layer 2 by zinc displacement over the surface of an aluminum conductor 1, which was made of a 0.90 mm diameter wire of 99.0% pure aluminum and had been degreased and etched.

An electroplating step S2 followed in which the aluminum conductor 1 coated with the zinc thin layer 2 was immersed in a strike copper plating bath at a temperature of 40° C. and energized for one minute under a plating condition of 2 A/square-dm current density to develop a copper plating layer 3a of 2 micrometers in thickness on its surface. In succession, the same was immersed in a copper sulfate plating bath at a temperature of 40° C. and energized for forty minutes under a plating condition of 5 A/square-dm current density to develop a thick copper plating layer 3b of 40 micrometers in thickness on its surface. Hence, a resultant copper coated aluminum conductor had a copper coating 3 composed of the two plating layers 3a and 3b.

Then, a thermal diffusion step S3 was applied in which the copper coated aluminum conductor was rinsed with water, dried out, and heat treated in an inert gas atmosphere of mainly nitrogen gas at 500° C. for one minute. Thus, a copper plated aluminum wire 9 which has an outer diameter of 0.98 mm was yielded.

Also, the 0.98 mm diameter copper plated aluminum wire 9 was subjected to a cold plastic working step S4 where it was passed through dies in a wire drawing machine and drawn to have an outer diameter of 0.10 mm.

Example 1-2

A copper plated aluminum wire 9 of 0.10 mm in outer diameter was fabricated from an aluminum conductor 1, which was a 0.90 mm diameter wire of Al—Mg alloy containing 95.0% pure aluminum, by the same manner as of Example 1-1.

Example 1-3

A copper plated aluminum wire 9 of 0.10 mm in outer diameter was fabricated from an aluminum conductor 1, which was a 0.90 mm diameter wire of Al—Mg—Si alloy containing 97.0% pure aluminum, by the same manner as of Example 1-1.

Example 1-4

A copper plated aluminum wire 9 of 0.10 mm in outer diameter was fabricated from an aluminum conductor 1, which was identical to that of Example 1-1, by the same manner as of Example 1-1, except that the thermal diffusion step S3 comprised water rinsing, drying, and thermal treatment under an inert gas atmosphere of mainly nitrogen gas at 400° C. for five minutes.

Example 1-5

A copper plated aluminum wire 9 of 0.10 mm in outer diameter was fabricated from an aluminum conductor 1, which was identical to that of Example 1-1, by the same manner as of Example 1-1, except that the thermal diffusion step S3 comprised water rinsing, drying, and thermal treatment under an inert gas atmosphere of mainly nitrogen gas at 200° C. for sixty minutes.

It is apparent from the graph of FIG. 3 that all the settings of time and temperature used in Examples 1-1 to 1-5 for heat treatment in the thermal diffusion step S3 are defined by Statement (1).

Comparison 1

A 0.90 mm diameter wire of 99.0% pure aluminum which was identical to that of Example 1-1 was employed as the aluminum conductor and subjected to the zinc displacement step S1 and the electroplating step S2 to provide a copper coating on its surface. Similarly to Example 1-1, a resultant copper coated aluminum conductor having an outer diameter of 0.98 mm was drawn in the cold plastic working step S4, thus producing a copper plated aluminum wire of 0.10 mm in outer diameter.

Examination for a Number of Disconnection in Drawing Process

Examples 1-1 to 1-5 and Comparison 1 were examined to determine how many times disconnections occurred in the drawing process. A result of the examination is listed in Table 1 shown below. It is noted that the number of disconnections was counted from 10 kg of the copper plated aluminum wires having an outer diameter of 0.10 mm at each assignment. The wire drawing was carried out uniformly using a reduction of 15% and a velocity of 400 m/min.

TABLE 1

Number of disconnections in drawing process

|  | Number of disconnections | Average weight (Kg) |
|---|---|---|
| Example 1-1 | 3 | 2.5 |
| Example 1-2 | 0 | 10.0 |
| Example 1-3 | 0 | 10.0 |
| Example 1-4 | 1 | 5.0 |
| Example 1-5 | 2 | 3.3 |
| Comparison 1 | 9 | 1.0 |

As apparent from the above Table 1, the method of the present invention allows a less number of disconnections encountered during the wire drawing process and thus provides a greater value of the average weight, which represents an average quantity of drawn wire per disconnection. Since Examples 1-2 and 1-3 produced no disconnection, their average weight will be higher in practice.

According to the method of fabricating copper plated aluminum wire (FIG. 1) according to the present invention, the thermal diffusion step S3 is specified in that the copper plated aluminum conductor is heat treated under an inert gas atmosphere at a temperature ranging from 120° C. to 600° C. so that thermal diffusion eases the stress of electrical deposition. Hence, a thermal diffusion layer is developed at the interface between the aluminum conductor 1 and the copper coating 3. Since the adhesion created by the electroplating and the adhesion produced by the thermal diffusion act in combination, the copper plated aluminum wire 9 can be minimized in diameter and weight. Also, when the temperature T (°C.) and the time T (minute) for the heat treatment are defined by Statement (1), the thermal diffusion layer at the interface between the aluminum conductor 1 and the copper coating 3 is formed in optimum conditions. Accordingly, the adhesion in the combination will be enhanced and undesired disconnection of the small diameter wire (e.g. of less than 0.10 mm) during the cold plastic working step S4 will be reduced remarkably. It is thus clear that the contribution of the present invention to relevant industries is significant.

Figure 4:
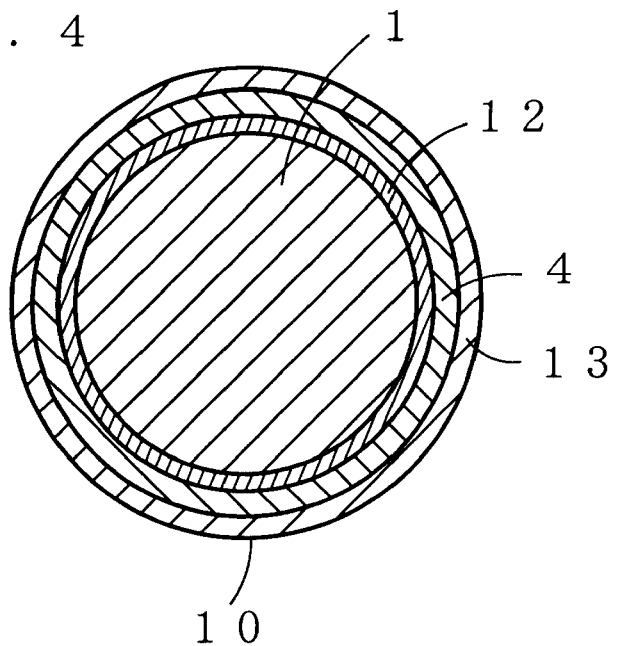
FIG. 4 is a cross sectional view of an embodiment of a plated aluminum wire according to the present invention.
Figure 5:
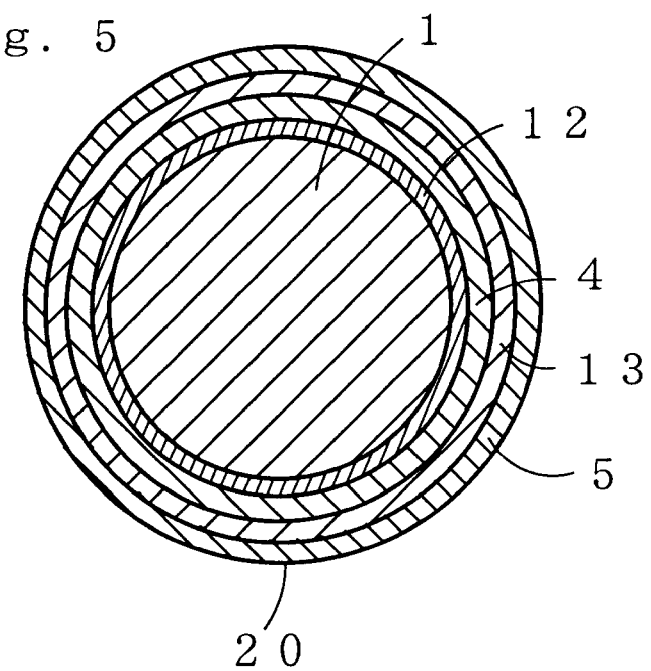
FIG. 5 is a cross sectional view of an embodiment of an insulating plated aluminum wire according to the present invention.
Figure 6:
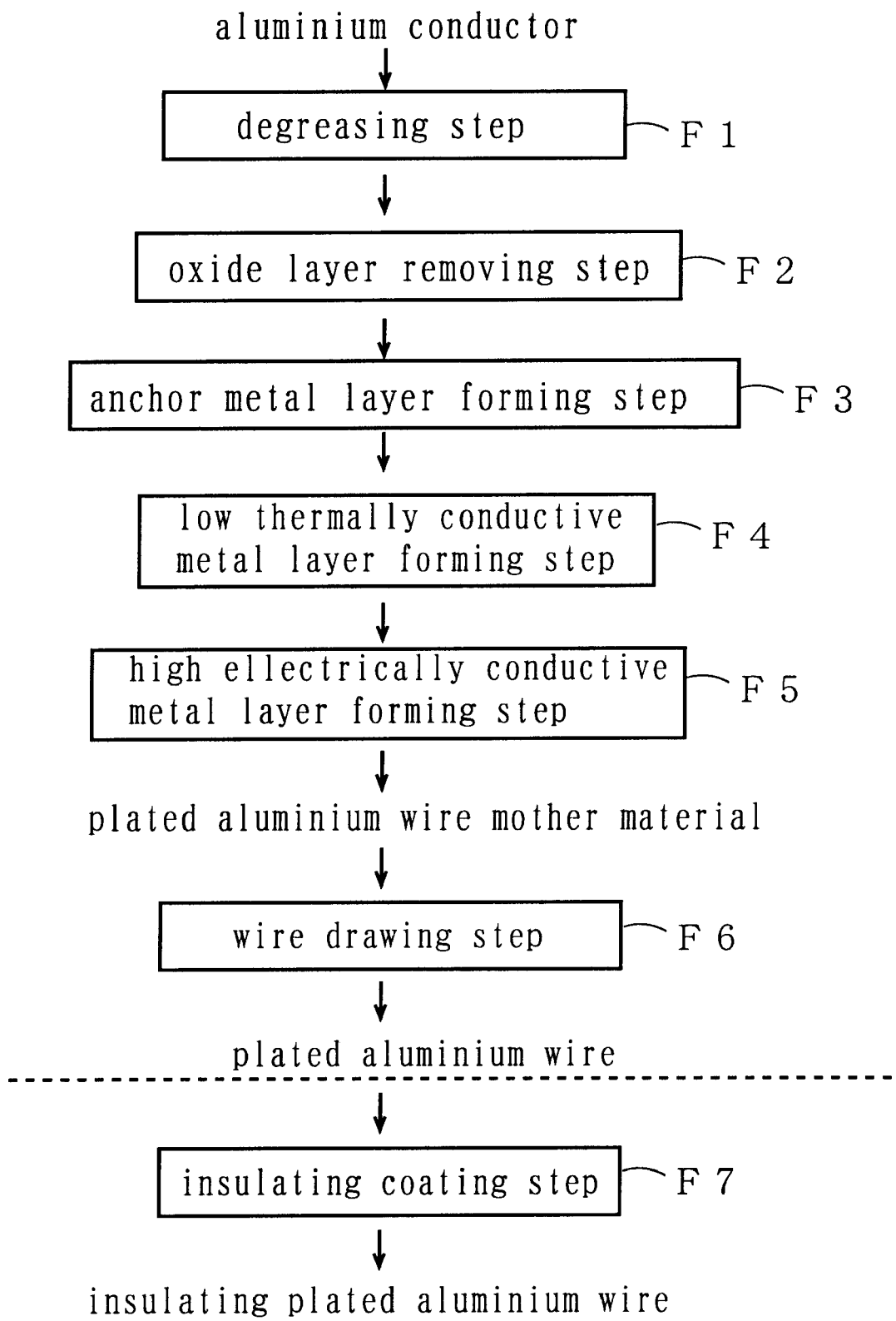
FIG. 6 is a flowchart of assembling an embodiment of a plated aluminum wire and an insulating plated aluminum wire according to the present invention.

FIG. 4 is a cross sectional view of an embodiment of a plated aluminum wire according to the present invention. FIG. 5 is a cross sectional view of an embodiment of an insulating plated aluminum wire according to the present invention. FIG. 6 is a flowchart of assembling an embodiment of a plated aluminum wire and an insulating plated aluminum wire according to the present invention.

Illustrated in the drawings are an aluminum conductor 1, an anchor metal layer 12, a low thermally conductive metal layer 4, a high electrically conductive metal layer 13, an insulating coating 5, a plated aluminum wire 10, and an insulating plated aluminum wire 20.

Example 2-1

Example 2-1 will now be explained in reference to FIG. 4 and FIG. 6. The aluminum conductor 1 is a 0.5 mm diameter wire of aluminum alloy.

At a degreasing step F1, the aluminum conductor 1 was immersed in a 30% KOH solution at 60° C. and energized at 10 A/square-dm for 20 seconds to removal oils from its surface.

At a oxide layer removing step F2, the aluminum conductor 1, that was degreased, was immersed in a 300 g/l NaOH solution at the room temperature for 15 seconds to remove a natural oxide layer, and then immersed in a 50% nitric acid solution at the room temperature for 15 seconds to activate its surface.

Then, at an anchor metal layer forming step F3 for displacement plating, the aluminum conductor 1 was immersed in a zinc displacement plating bath containing 25 g/l of ZnO and 170 g/l of NaOH at the room temperature for 30 seconds to deposit a zinc layer on its surface. For increasing the density and adhesion of the zinc layer, the same was immersed again in the nitric acid solution to remove the zinc layer and then in the zinc displacement plating bath at the room temperature for 20 seconds to deposit a zinc plating anchor metal layer 12 of 1 micrometer in thickness.

At a low thermally conductive metal layer forming step F4 for electroplating, the aluminum conductor 1 with the zinc plating anchor metal layer 12 was immersed in a strike nickel plating bath containing for 200 g/l of NiCI and 100 ml/l of HCI at 30° C., and energized at 4 A/square-dm for two minutes to develop a nickel plating low thermally conductive metal layer 4 of 2 micrometers in thickness.

At a high electrically conductive metal layer forming step F5 for electroplating, the same was immersed in a thick copper plating bath, which contained 220 g/l of copper sulfate five hydrate ($CuSO_4.5H_2O$) and 50 g/l of sulfuric acid and was maintained at 30° C., and was energized at 10 A/square-dm for three minutes to deposit a copper plating high electrically conductive metal layer 13 of 7 micrometers in thickness on its surface. A resultant was provided as a plated aluminum wire mother material.

At a wire drawing step F6, the plated aluminum wire mother material was subjected to cold drawing process to a plated aluminum wire 10 having a diameter of 0.10 mm. It was found that the cross-sectional area of the aluminum conductor 1 was about 97% of the entire cross-sectional area of the plated aluminum wire 10.

Examples 2-2 to 2-4

Examples 2-2 to 2-4 are now explained. The steps from starting with the aluminum conductor 1 to the plated aluminum wire mother material was identical to those of Example 2-1. The plated aluminum wire mother material produced by the same manner as of Example 2-1 was subjected to a cold drawing step F6 where it was drawn to have a plated aluminum wire 10 having a diameter of 0.08 mm (Example 2-2), a plated aluminum wire 10 having a diameter of 0.05 mm (Example 2-3), and a plated aluminum wire 10 having a diameter of 0.03 mm (Example 2-4).

Example 2-5

Example 2-5 is explained in reference to FIG. 4 to FIG. 6. Also, the steps from starting with the aluminum conductor 1 to a plated aluminum wire mother material was identical to those of Example 2-1.

After the plated aluminum wire mother material was subjected to cold drawing at the wire drawing step F6, a plated aluminum wire 10 having a diameter of 0.05 mm was fabricated.

Then, at an insulating coating step F7, a polyurethane insulating varnish was applied to the surface of the plated aluminum wire 10 and baked to have a polyurethane insulating coating 5 of 5 micrometers in thickness. A resultant is an insulating plated aluminum wire 20 having a diameter of 0.06 mm.

Property Test

The plated aluminum wires 10 of Examples 2-1 to 2-4 are compared with common aluminum wires and copper clad aluminum wires in the respect of disconnection during soldering. Results of the comparison are listed in Table 2. The soldering with a Pb/Sn=40/60 soldering paste was carried out on 10 test pieces of 100 mm in length of each sample by a manner in which the tip of a soldering iron being heated to 360° C. touches a central region of the test piece.

TABLE 2

Disconnection during soldering
(the number of disconnections per the number of test pieces)

| Diameter(mm) | Plated aluminum (Examples) | Aluminum | Copper-clad aluminum |
|---|---|---|---|
| 0.10 | (2-1) 0/10 | 1/10 | 0/10 |
| 0.08 | (2-2) 0/10 | 2/10 | 1/10 |
| 0.05 | (2-3) 0/10 | 3/10 | 1/10 |
| 0.03 | (2-4) 0/10 | 3/10 | 2/10 |

As apparent from Table 2, the plated aluminum wires 10 of the present invention produce no disconnection even when their diameter is very small.

According to the plated aluminum wire 10, the insulating plated aluminum wire 20, and the method of fabricating the same (FIG. 6), the low thermally conductive metal layer 4 is provided between the anchor metal layer 12 and the high electrically conductive metal layer 13 hence minimizing the possibility of disconnection during the thin wire soldering. Also, the high electrically conductive metal layer 13 is deposited by the electroplating to a desired thickness whereby a resultant wire will have a ratio of the cross-sectional area of the conductor to the cross-sectional area of the wire of at least 85%. Since the insulating plated aluminum wire 20 is thoroughly coated with an insulating layer 5 by application and baling, it may be used as a coil material thus contributing to the weight reduction of an electronic component.

Figure 7:
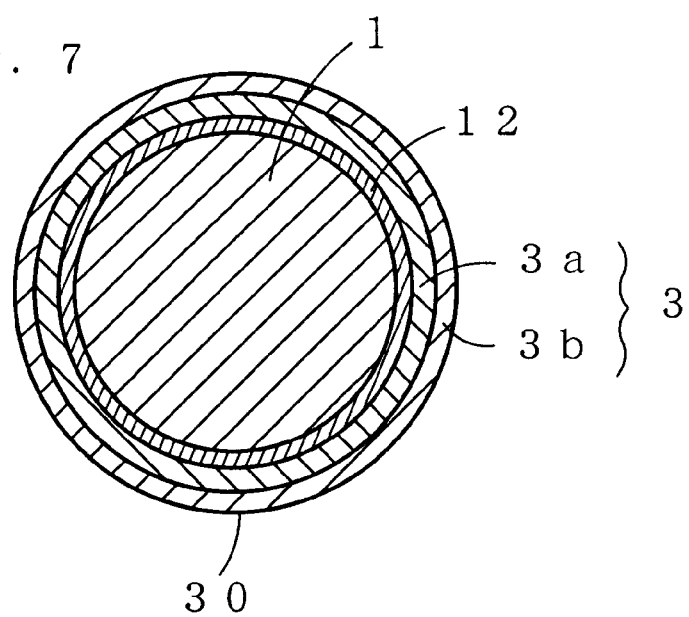
FIG. 7 is a cross sectional view of another embodiment of the plated aluminum wire according to the present invention.

FIG. 7 is a cross sectional view of another embodiment of the plated aluminum wire according to the present invention.

Figure 8:
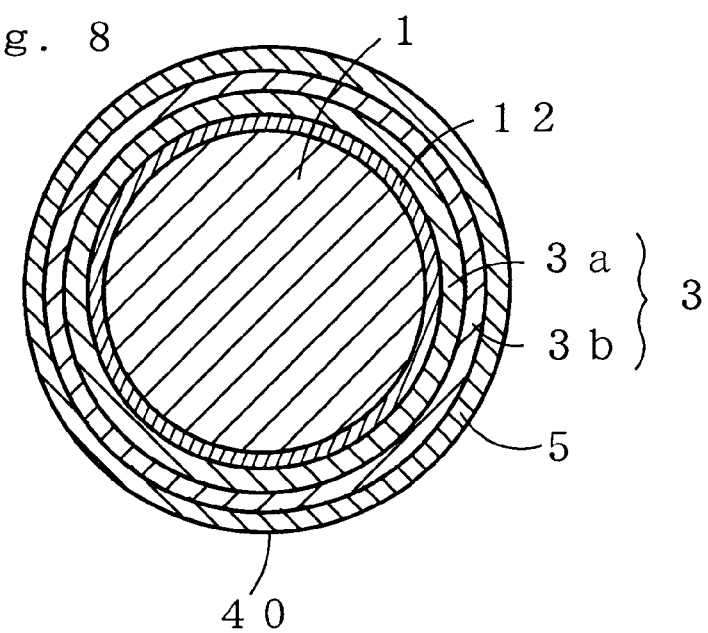
FIG. 8 is a cross sectional view of another embodiment of the insulating plated aluminum wire according to the present invention.
Figure 9:
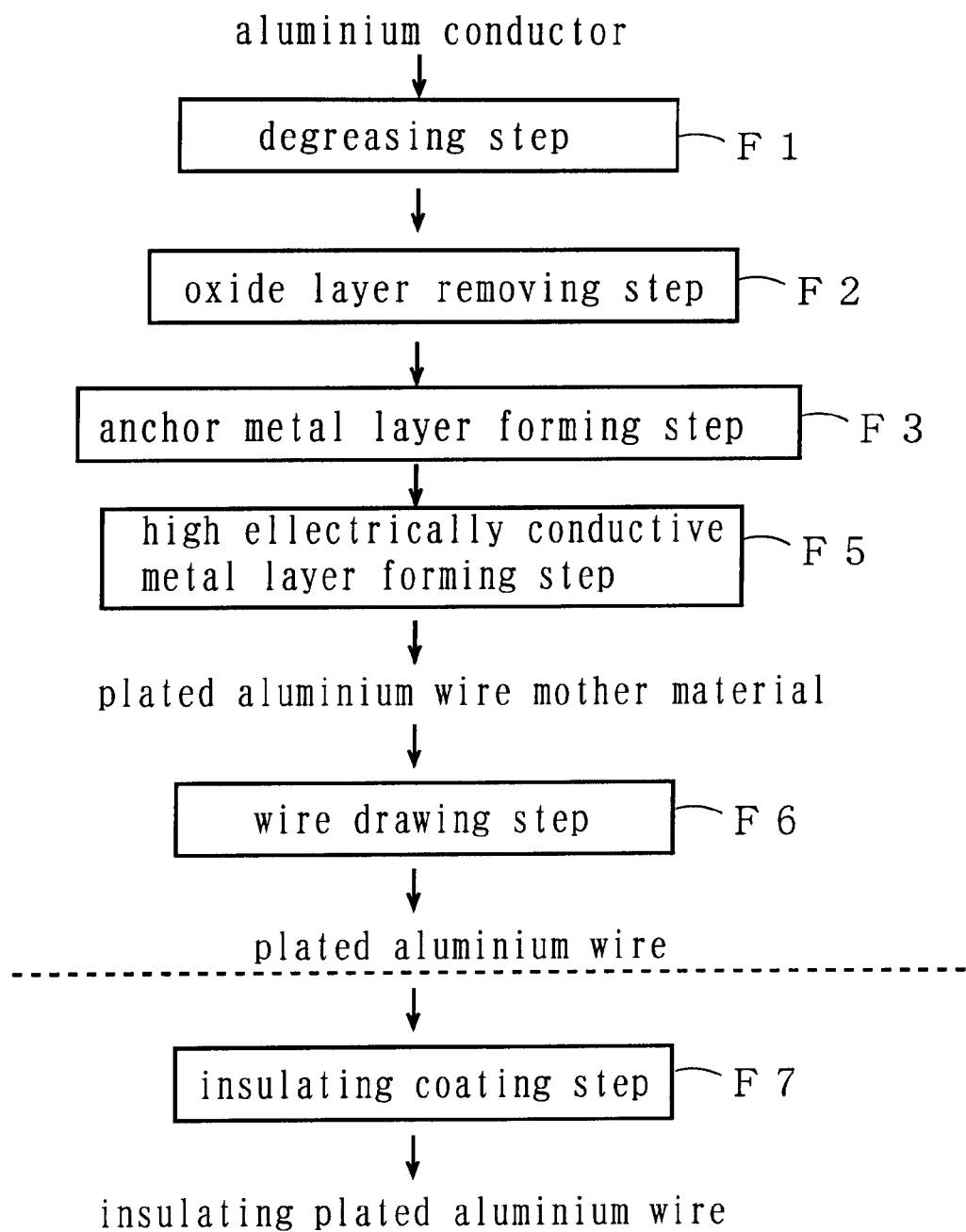
FIG. 9 is a flowchart of assembling another embodiment of plated aluminum wire and the insulating plated aluminum wire according to the present invention.

FIG. 8 is a cross sectional view of another embodiment of the insulating plated aluminum wire according to the present invention. FIG. 9 is a flowchart of assembling another embodiment of the plated aluminum wire and the insulating plated aluminum wire of the present invention.

Shown in the drawings are an aluminum conductor 1, an anchor metal layer 12, a high electrically conductive layer 3, a strike plating layer 3a, a thick plating layer 3b, an insulating coating 5, a plated aluminum wire 30, and an insulating plated aluminum wire 40.

Example 3-1

Example 3-1 will now be described in reference to FIG. 7 and FIG. 9. The aluminum conductor 1 was a 0.5 mm diameter wire of aluminum alloy.

At a degreasing step F1, the aluminum conductor 1 was immersed in a 30% KOH solution at 60° C. and energized at 10 A/square-dm for 20 seconds to remove oils from its surface.

At a succeeding oxide layer removing step F2, the aluminum conductor 1, that was degreased, was immersed in a 300 g/l NaOH solution at the room temperature for 15 seconds to remove a natural oxide layer and then immersed in a 50% nitric acid solution at the room temperature for 15 seconds to activate its surface.

Then, at an anchor metal layer forming step F3 for displacement plating, the aluminum conductor 1 was immersed in a zinc displacement plating bath containing 25 g/l of ZnO and 170 g/l of NaOH at the room temperature for 30 seconds to deposit a zinc layer on its surface. For increasing the density and adhesive properties of the zinc layer, the same was immersed again in the nitric acid solution to remove the zinc layer and then in the zinc displacement plating bath at the room temperature for 20 seconds to deposit a zinc plating anchor metal layer 12 of 1 micrometer in thickness.

At a high electrically conductive metal layer forming step F4 for electroplating, the same was further immersed in a strike copper plating bath, which contained 75 g/l of copper sulfate five hydrate ($CuSO_4 \cdot 5H_2O$) and 200 g/l of sulfuric acid and was maintained at 30° C., and was energized at 4 A/square-dm for two minutes to deposit a strike copper plating layer 3a of 2 micrometers in thickness on its surface. The same was further immersed in a thick copper plating bath, which contained 220 g/l of copper sulfate five hydrate ($CuSO_4 \cdot 5H_2O$) and 50 g/l of sulfuric acid and was maintained at 30° C., and was energized at 10 A/square-dm for three minutes to deposit a thick copper plating layer 3b of 7 micrometers in thickness over the strike copper plating layer 3a. A resultant was provided as a plated aluminum wire mother material with the high electrically conductive metal layer 3.

At a wire drawing F5, the plated aluminum wire mother material was subjected to cold drawing thus shifting to a plated aluminum wire 30 having a diameter of 0.15 mm. It was found that the cross-sectional area of the aluminum conductor 1 was about 97% of the entire cross-sectional area of the plated aluminum wire 30.

Example 3-2

Example 3-2 is now explained in reference to FIG. 7 to FIG. 9.

An insulating coating step F6 was conducted in which a polyurethane insulating varnish was applied to the surface of the plated aluminum wire 30 having a diameter of 0.15 mm of Example 3-1 and baked to have a polyurethane insulating layer 5 of 5 micrometers in thickness. A resultant was an insulating plated aluminum wire 40 having an outer diameter of 0.16 mm.

According to the plated aluminum wire 30, the insulating plated aluminum wire 40, and the method of fabricating the same (FIG. 9), the high electrically conductive metal layer 3 is deposited by the electroplating to a desired thickness whereby a resultant wire 30 or 40 will have a ratio of the cross-sectional area of the conductor to the cross-sectional area of the wire of at least 85%. Since the insulating plated aluminum wire 40 is thoroughly coated with an insulating layer 5 by application and baking, it may be used as a coil material thus contributing to the weight reduction of an electronic component.

Figure 10:
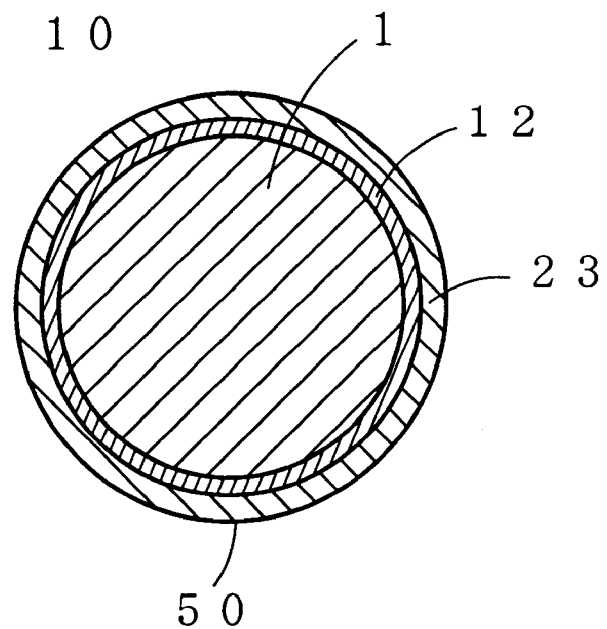
FIG. 10 is a cross sectional view of of an embodiment of a composite lightweight plated wire having a single layer of conductive metal according to the present invention.
Figure 11:
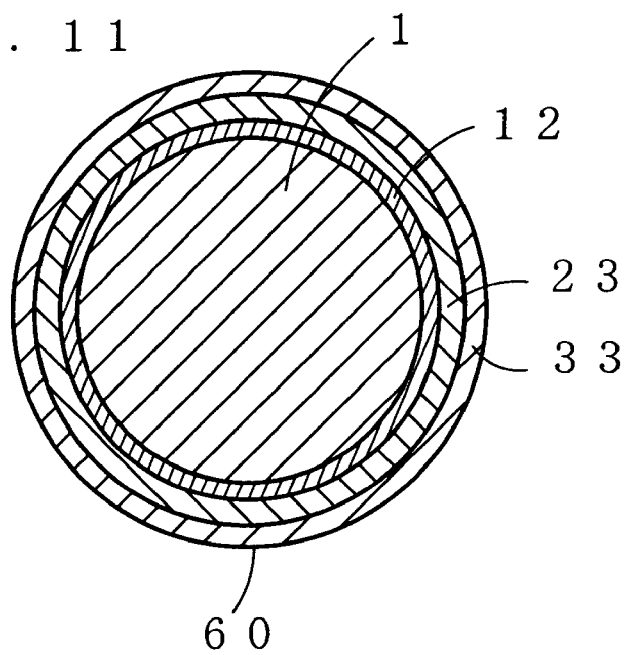
FIG. 11 is a cross sectional view of of an embodiment of a composite lightweight plated wire having two layers of conductive metal according to the present invention.

FIG. 10 and FIG. 11 are cross sectional views of embodiments of the composite lightweight plated wire according to the present invention. FIG. 10 is a cross-sectional view of an embodiment of the composite lightweight plated wire having a single layer of conductive metal and FIG. 11 is a cross-sectional view of an embodiment of the composite lightweight plated wire having two layers of conductive metal.

As shown in FIG. 10 and FIG. 11, there are an aluminum or aluminum alloy conductor 1 (an aluminum conductor), a zinc or zinc alloy anchor metal layer 12 (a zinc anchor metal layer), a conductive metal layer 23 (a first conductive metal layer) having a potential higher than that of zinc, another conductive metal layer 33 (a second conductive metal layer) having a potential higher than that of zinc, and the composite lightweight plated wires 50 and 60.

Example 4-1

A 0.10 mm diameter wire of 99.9% pure aluminum was used as the aluminum conductor 1 and subjected to a zincating process, which comprises degreasing, etching, neutralizing, first zinc replacing, zinc removing, and second zinc replacing, to develop a zinc anchor metal layer 12 of 0.5 micrometer in thickness on its surface. The same was immersed in a copper pyrophosphate plating bath, which contained 100 g/l of copper pyrophosphate, 300 g/l of potassium pyrophosphate, and 2 ml/l of liquid ammonia and was maintained at 55° C., and was energized under a condition of 2 A/square-dm at cathode current density and 8.5 at pH level for four minutes to deposit a copper conductive metal layer 23 of 2 micrometers in thickness. A resultant was a composite lightweight plated wire 50 having an outer diameter of 0.104 mm. This composite lightweight plated wire 50 may be used as the composite light-weighted plated wire mother material.

Example 4-2

A 0.90 mm diameter wire of 99.9% pure aluminum was used as the aluminum conductor 1 and subjected to the same zincating process as of Example 4-1 to develop a zinc anchor metal layer 12 of 0.5 micrometer in thickness on its surface. Then, the same was immersed in the same copper pyrophosphate plating bath as of Example 4-1 at 55° C. and was energized under a condition of 1 A/square-dm at cathode current density and 8.5 at pH level 5 for two minutes to deposit a first copper conductive metal layer 23 of 0.4 micrometer in thickness. The same was further immersed in a copper sulfate plating bath, which contained 200 g/l of copper sulfate and 50 g/l of sulfuric acid, and was maintained at 30° C., and was energized under a condition of 5

A/square-dm at cathode current density and 0.5 at pH level for ten minutes to deposit a second copper conductive metal layer 33 of 10 micrometers in thickness over the first copper conductive metal layer 23. A resultant was a composite lightweight plated wire mother material having an outer diameter of 0.922 mm. Then, the composite lightweight plated wire mother material was subjected to heat treatment at 200° C. for five minutes for easing its stress distortion, and to cold drawing, yielding a composite lightweight plated wire 60 having an outer diameter of 0.10 mm.

Example 4-3

A 0.90 mm diameter wire of 99.9% pure aluminum was used as the aluminum conductor 1 and subjected to the same zincating process as of Example 4-1 to develop a zinc anchor metal layer 12 of 0.5 micrometer in thickness on its surface. Then, the same was immersed in a copper cyanide plating bath, which contained 40 g/l of copper cyanide, 60 g/l of sodium cyanide, 20 g/l of potassium sodium tartrate, and 10 g/l of sodium carbonate and was maintained at 50° C., and was energized under a condition of 2 A/square-dm at cathode current density and 12 at pH level for two minutes to deposit a first copper conductive metal layer 23 of 0.8 micrometer in thickness. The same was further immersed in the same copper sulfate plating bath as of Example 4-2, and was energized under the same conditions as of Example 4-2 for ten minutes to deposit a second copper conductive metal layer 33 of 10 micrometers in thickness over the first copper conductive metal layer 23. A resultant was a composite lightweight plated wire mother material having an outer diameter of 0.923 mm. Then, the composite lightweight plated wire mother material was subjected to heat treatment at 200° C. for five minutes for easing its stress distortion, and to cold drawing, yielding a composite lightweight plated wire 60 having an outer diameter of 0.10 mm.

Example 4-4

A 0.90 mm diameter wire of 99.9% pure aluminum was used as the aluminum conductor 1 and subjected to the same zincating process as of Example 4-1 to develop a zinc anchor metal layer 12 of 0.5 micrometer in thickness on its surface. Then, the same was immersed in a nickel sulfate plating bath, which contained 80 g/l of nickel sulfate, 30 g/l of ammonia chloride, and 80 g/l of sodium sulfuric an hydride and was maintained at 30° C., and was energized under a condition of 2 A/square-dm at cathode current density and 5.5 at pH level for two minutes to deposit a first nickel conductive metal layer 23 of 0.4 micrometer in thickness. The same was further immersed in the same copper sulfate plating bath as of Example 4-2, and was energized under the same conditions as of Example 4-2 for ten minutes to deposit a second copper conductive metal layer 33 of 10 micrometers in thickness over the first nickel conductive metal layer 23. A resultant was a composite lightweight plated wire mother material having an outer diameter of 0.922 mm. Then, the composite lightweight plated wire mother material was subjected to heat treatment at 200° C. for five minutes for easing its stress distortion, and to cold drawing, yielding a composite lightweight plated wire 60 having an outer diameter of 0.10 mm.

Example 4-5

A 0.90 mm diameter wire of 99.9% pure aluminum was used as the aluminum conductor 1 and subjected to the same zincating process as of Example 4-1 to develop a zinc anchor metal layer 12 of 0.5 micrometer in thickness on its surface. Then, the same was immersed in a zinc cyanide plating bath, which contained 60 g/l of zinc cyanide, 40 g/l of sodium cyanide, and 80 g/l of sodium hydroxide and was maintained at 30° C., and was energized under a condition of 2 A/square-dm at cathode current density and 12 at pH level for two minutes to deposit a first zinc conductive metal layer 23 of 1.0 micrometer in thickness. The same was further immersed in the same copper sulfate plating bath as of Example 4-2, and was energized under the same conditions as of Example 4-2 for ten minutes to deposit a second copper conductive metal layer 33 of 10 micrometers in thickness over the first zinc conductive metal layer 23. A resultant was a composite lightweight plated wire mother material having an outer diameter of 0.926 mm. Then, the composite lightweight plated wire mother material was subjected to heat treatment at 200° C. for five minutes for easing its stress distortion, and to cold drawing, yielding a composite lightweight plated wire 60 having an outer diameter of 0.10 mm.

Example 4-6

A 0.90 mm diameter wire of 99.9% pure aluminum was used as the aluminum conductor 1 and subjected to the same zincating process as of Example 4-1 to develop a zinc anchor metal layer 12 of 0.5 micrometer in thickness on its surface. Then, the same was immersed in a silver cyanide plating bath, which contained 2 g/l of silver cyanide and 100 g/l of potassium cyanide and was maintained at 25° C., and was energized under a condition of 1 A/square-dm at cathode current density and 12 at pH level for one minute to deposit a first silver conductive metal layer 23 of 0.6 micrometer in thickness. The same was further immersed in the same copper sulfate plating bath as of Example 4-2, and was energized under the same conditions as of Example 4-2 for ten minutes to deposit a second copper conductive metal layer 33 of 10 micrometers in thickness over the first silver conductive metal layer 23. A resultant was a composite lightweight plated wire mother material having an outer diameter of 0.922 mm. Then, the composite lightweight plated wire mother material was subjected to heat treatment at 200° C. for five minutes for easing its stress distortion and to cold drawing, yielding a composite lightweight plated wire 60 having an outer diameter of 0.10 mm.

Example 4-7

A 0.90 mm diameter wire of 93% pure aluminum-magnesium alloy was used as the aluminum conductor 1 and subjected to the same zincating process as of Example 4-1 to develop a zinc anchor metal layer 12 of 0.5 micrometer in thickness on its surface. Then, the same was immersed in a gold cyanide plating bath, which contained 8 g/l of gold cyanide, and 30 g/l of potassium hydrogen phosphate and was maintained at 60° C., and was energized under a condition of 0.5 A/square-dm at cathode current density and 12 at pH level for one minute to deposit a first gold conductive metal layer 23 of 0.2 micrometer in thickness. The same was further immersed in the same copper sulfate plating bath as of Example 4-2, and was energized under the same conditions as of Example 4-2 for ten minutes to deposit a second copper conductive metal layer 33 of 10 micrometers in thickness over the first copper conductive metal layer 23. A resultant was a composite lightweight plated wire mother material having an outer diameter of 0.921 mm. Then, the composite lightweight plated wire mother material was subjected to heat treatment at 200° C. for five minutes for easing its stress distortion, and to cold drawing before yielding a composite lightweight plated wire 60 having an outer diameter of 0.10 mm.

Example 4-8

Similar to Example 4-2, a 0.10 mm diameter wire of 99.9% pure aluminum was coated with a first copper conductive metal layer 23 of 0.4 micrometer in thickness on its surface. Then, the same was immersed in the same copper sulfate plating bath at 30° C. as of Example 4-2, and was energized under a condition of 5 A/square-dm at cathode current density and 0.5 at pH level for two minutes to deposit a second copper conductive metal layer 33 of 2 micrometers in thickness over the first copper conductive metal layer 23. A resultant was a composite lightweight plated wire mother material having an outer diameter of 0.906 mm. Then, the composite lightweight plated wire mother material was subjected to heat treatment at 200° C. for five minutes for easing its stress distortion, and to cold drawing before yielding a composite lightweight plated wire 60 having an outer diameter of 0.10 mm.

Example 4-9

Similar to Example 4-2, a 0.10 mm diameter wire of 99.9% pure aluminum was coated with a first copper conductive metal layer 23 of 0.4 micrometer in thickness on its surface. Then, the same was immersed in the same copper sulfate plating bath at 30° C. as of Example 4-2, and was energized under a condition of 5 A/square-dm at cathode current density and 0.5 at pH level for forty minutes to deposit a second copper conductive metal layer 33 of 40 micrometers in thickness over the first copper conductive metal layer 23. A resultant was a composite lightweight plated wire mother material having an outer diameter of 0.982 mm. Then, the composite lightweight plated wire mother material was subjected to heat treatment at 200° C. for five minutes for easing its stress distortion, and to cold drawing before yielding a composite lightweight plated wire 60 having an outer diameter of 0.10 mm.

Comparison 2

A 0.90 mm diameter wire of 99.9% pure aluminum was used as the aluminum conductor 1 and subjected to the same zincating process as of Example 4-1 to develop a zinc anchor metal layer 12 of 0.5 micrometer in thickness on its surface. Then, the same was immersed in an acidic copper sulfate plating bath, which contained 100 g/l of copper sulfate and 50 g/l of sulfuric acid and was maintained at 30° C., and was energized under a condition of 2 A/square-dm at cathode current density and 0.5 at pH level for two minutes to deposit a first copper conductive metal layer 23 of 0.4 micrometer in thickness. The same was further immersed in the same copper sulfate plating bath as of Example 4-2, and was energized under the same conditions as of Example 4-2 for ten minutes to deposit a second copper conductive metal layer 33 of 10 micrometers in thickness over the first copper conductive metal layer 23. A resultant was a composite lightweight plated wire mother material having an outer diameter of 0.922 mm. Then, the composite lightweight plated wire mother material was subjected to heat treatment at 200° C. for five minutes for easing its stress distortion and to cold drawing, yielding a composite lightweight plated wire 60 having an outer diameter of 0.10 mm.

Comparison 3

A 0.90 mm diameter wire of 99.9% pure aluminum was used as the aluminum conductor 1 and subjected to the same zincating process as of Example 4-1 to develop a zinc anchor metal layer 12 of 0.5 micrometer in thickness on its surface. Then, the same was immersed in a nickel chloride plating bath, which contained 100 g/l of nickel sulfate, 60 g/l of nickel chloride, 45 g/l of boric acid, and 10 g/l of ferrous sulfate and was maintained at 60° C., and was energized under a condition of 2 A/square-dm at cathode current density and 3.5 at pH level for two minutes to deposit a first nickel-iron alloy conductive metal layer 23 of 0.4 micrometer in thickness. The same was further immersed in the same copper sulfate plating bath as of Example 4-2, and was energized under the same conditions as of Example 4-2 for ten minutes to deposit a second copper conductive metal layer 33 of 10 micrometers in thickness over the first conductive metal layer 23. A resultant was a composite lightweight plated wire mother material having an outer diameter of 0.922 mm. Then, the composite lightweight plated wire mother material was subjected to heat treatment at 200° C. for five minutes for easing its stress distortion, and to cold drawing, yielding a composite lightweight plated wire 60 having an outer diameter of 0.10 mm.

Property Test

The above composite lightweight plated wires of Examples 4-1 to 4-9 and of Comparisons 2 and 3 were tested for properties. Test results are illustrated below.

(1) Wire Drawing Test

The composite lightweight plated wires of Examples 4-2 to 4-9 and of Comparisons 2 and 3 having an outer diameter of 0.10 mm were examined to determine how many disconnections per unit of 5 kg appeared in the drawing process. The result is listed in Table 3 below.

TABLE 3

| Number of disconnections in wire drawing (times/5 kg) | | | | | | | | | |
|---|---|---|---|---|---|---|---|---|---|
| Examples | | | | | | | | Comparisons | |
| 4-2 | 4-3 | 4-4 | 4-5 | 4-6 | 4-7 | 4-8 | 4-9 | 2 | 3 |
| 2 | 1 | 2 | 3 | 2 | 1 | 2 | 1 | 10 | 8 |

As apparent from Table 3, the plating bath, used as an electrolyte solution for depositing a conductive metal layer 23 having a potential higher than that of zinc on the zinc anchor metal layer 12 and having a pH level of 4 or higher, allows the composite lightweight plated wires of Examples 4-2 to 4-9 to minimize the probability of disconnection during the wire drawing process.

(2) Zinc Dissolution Test (For Evaluating the Holding of a Zinc Anchor Metal Layer)

The composite lightweight plated wires, of Examples 4-1 to 4-9 and of Comparisons 2 and 3 before subjected to the drawing process, were tested for examining a rate of dissolution (%) of zinc by the zinc anchor metal layer holding evaluating test method wherein the anchor metal layer 12 and the electrically conductive metal layers 23 and 33 were exposed to nitric acid and a resultant dissolution of zinc per unit area from the layers was measured with an atomic absorption spectroscopy meter. A result of the test is shown in Table 4 below. The dissolution rate (%) of zinc=100–the remaining of zinc (%) in the zinc anchor metal layer.

TABLE 4

Zinc dissolution test (pH level and dissolution rate %)

| | Examples | | | | | | | | | Comparisons | |
|---|---|---|---|---|---|---|---|---|---|---|---|
| | 4-1 | 4-2 | 4-3 | 4-4 | 4-5 | 4-6 | 4-7 | 4-8 | 4-9 | 2 | 3 |
| pH | 8.5 | 8.5 | 12 | 5.5 | 12 | 12 | 12 | 8.5 | 8.5 | 0.5 | 0.5 |
| % | 5 | 6 | 3 | 17 | 2.5 | 1 | 2 | 10 | 4 | 50 | 29 |

As apparent from Table 4, the composite lightweight plated wires of the present invention exhibit less than 20% of the dissolution of zinc thus holding 80% and more of zinc in their zinc anchor metal layer 12. It is clear that the lower the pH level in the electrolyte solution for electroplating the zinc anchor metal layer 12, the higher the dissolution rate of zinc is increased or the more the remaining of zinc in the zinc anchor metal layer is decreased. The dissolution of zinc is closely related to the cause of disconnection during the drawing process. Referring to Table 3, it may be understood that the electroplated wires with less than 20% of the zinc dissolution rate produce a less number of disconnections.

(3) Surface Inspection Test of Composite Lightweight Plated Wires

Figure 12:
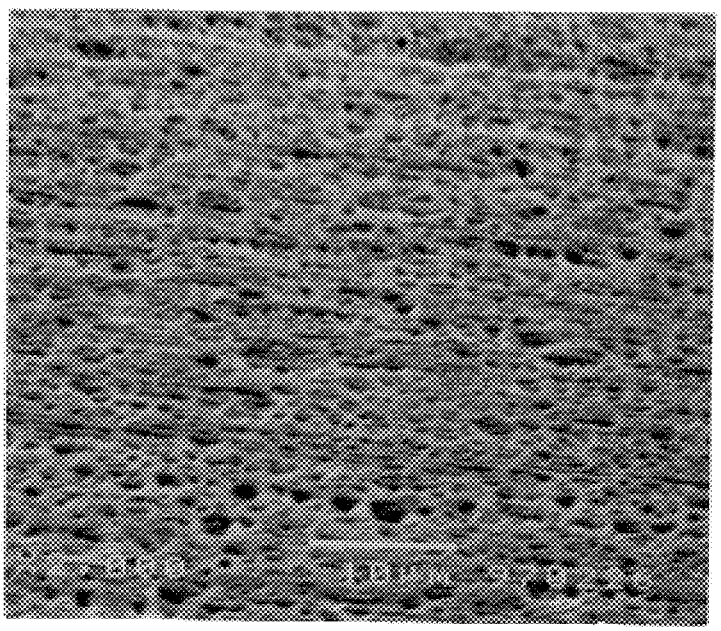
FIG. 12 is a SEM photographic picture of a surface of plating of on an Example 14 of an embodiment of a composite lightweight plated wire according to the present invention.
Figure 13:
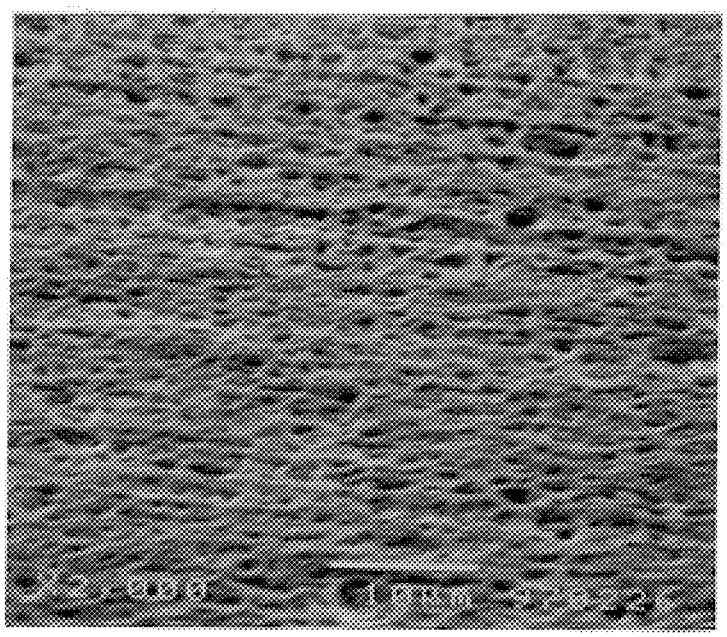
FIG. 13 is a SEM photographic picture of a surface of plating of on an Example 15 of an embodiment of a composite lightweight plated wire according to the present invention.
Figure 14:
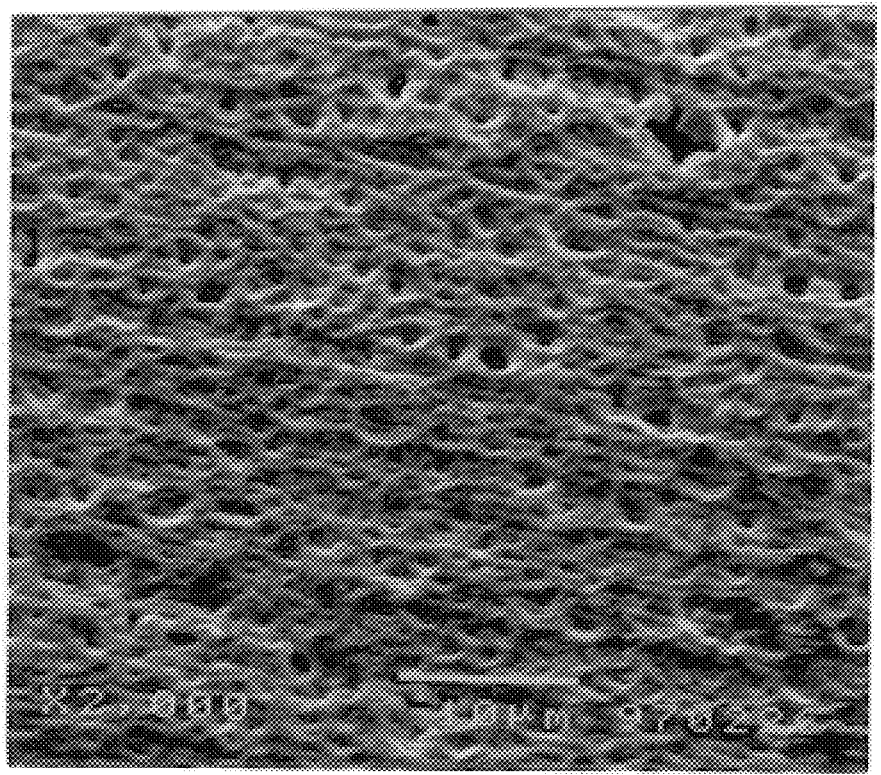
FIG. 14 is a SEM photographic picture of a surface of plating of on an Comparison 2.

The composite lightweight plated wires of Examples 4-1 and 4-3 and of Comparison 2 were inspected on the plating coatings on their surface using a scanning electron microscope (SEM). Resultant SEM pictures are shown in FIG. 11, FIG. 12 and FIG. 13. FIG. 11 is a cross-sectional view of the composite lightweight plated wire of Example 4-1. FIG. 12 is a cross-sectional view of the composite lightweight plated wire of Example 4-2. FIG. 13 is a cross-sectional view of the composite lightweight plated wire of Comparison 2.

As apparent from the SEM pictures of FIG. 11 to FIG. 13, the composite lightweight plated wire of Comparison 2 (FIG. 13) has a multiplicity of pits in its surface. Comparing between two Tables 3 and 4, it is proved that the pits in the plating layers produced by the dissolution and the chemical displacement of zinc defines its adhesive properties to the core. Thus, this causes disconnections during the plastic forming process such as wire drawing.

It is also found through a solder wetting test, though not shown, that the reliability of soldered joints on the composite lightweight plated wires of the present invention is higher.

The composite lightweight plated wires of the present invention has an electrically conductive metal layer deposited on the surface of its zinc anchor metal layer over the aluminum conductor by the electroplating which is conditioned by the fact that the hydrogen ion concentration in the electrolyte solution (pH) is 4 or higher and the thickness x (micrometer) of plating is $0.2 < x \leq 5$. Accordingly, since the dissolution and the chemical displacement of zinc are attenuated, each of the resultant plating layers has an improvement in adhesive properties. Thus, this minimizes the probability of disconnection during the wire drawing process and ensures reduction of the diameter and the weight of each of the composite lightweight plated wires. Also, the electrically conductive metal layer rejects the effect of natural oxidation and, hence improves the reliability of soldering work. The composite lightweight plated wires will thus contribute to the improvement of performance and the reduction of size and weight of electronic devices or components and will find major roles in the relevant industries.

What is claimed is:

1. A method of fabricating a composite lightweight plated wire in which the composite lightweight plated wire is comprised of:

a conductor having an outer surface and being made of a metal selected from the group consisting of aluminum and aluminum alloy;

an anchor metal layer having an outer surface over said outer surface of said conductor, said anchor metal layer being made of zinc or zinc alloy;

a first electrically conductive metal layer on said anchor layer and being made of copper or copper alloy and having a thickness of greater than 0.2 micrometers and not exceeding 5 micrometers; and a second electrically conductive metal layer made of copper or copper alloy and having a plating thickness of greater than 2.0 micrometers and not exceeding 40 micrometers;

the method of fabricating said composite lightweight plated wire comprising:

a degreasing step of removing oil from said outer surface of said conductor;

an oxide layer removing step of removing a natural oxide layer from said conductor;

an anchor metal forming step of depositing said anchor metal layer by displacement plating over said conductor;

a first electrically conductive metal layer forming step of depositing said first electrically conductive metal layer by electroplating over said anchor metal layer;

a second electrically conductive metal layer forming step of depositing said second electrically conductive metal layer by electroplating over said first electrically conductive metal layer to form a composite lightweight plated wire material;

carrying out said second electroplating step in an electrolyte solution having a concentration of hydrogen ion (pH) of higher than 4 as an electrolysis parameter;

a heat treatment step of heat treating said composite lightweight plated wire material at about 150° C. to 250° C.; and a plastic working step of plastic working said composite lightweight plated wire material to have a desired size.

2. The method of fabricating the composite lightweight plated wire according to claim 1, wherein said plastic working step is selected from the group consisting of cold plastic working and hot plastic working.

3. A method of fabricating a composite lightweight plated wire in which the composite lightweight plated wire is comprised of:

a conductor having an outer surface and being made of a metal selected from the group consisting of aluminum and aluminum alloy;

an anchor metal layer having an outer surface over said outer surface of said conductor, said anchor metal layer being made of zinc or zinc alloy; and an electrically conductive metal layer on said anchor layer and being made of copper or copper alloy metal layer and having a plating thickness of greater than 0.2 micrometers and not exceeding 5 micrometers:

the method of fabricating said composite lightweight plated wire comprising:

a degreasing step of removing oil from said outer surface of said conductor;

an oxide layer removing step of removing a natural oxide layer from said conductor;

an anchor metal forming step of depositing said anchor metal layer by displacement plating over said conductor;

an electrically conductive metal layer forming step of depositing said electrically conductive metal layer by electroplating over said anchor metal layer to form a composite lightweight plated wire material;

carrying out said electroplating step in an electrolyte solution having a concentration of hydrogen ion (pH) of higher than 4 as an electrolysis parameter;

a heat treatment step of heat treating said composite lightweight plated wire material at about 150° C. to 250° C.; and a plastic working step of plastic working said composite lightweight plated wire material to have a desired size.

4. The method of fabricating the composite lightweight plated wire according to claim 3, wherein said plastic working step is selected from the group consisting of cold plastic working and hot plastic working.

5. A method of fabricating a composite lightweight plated wire comprising:

an anchor metal forming step of depositing an anchor metal layer by displacement plating over a conductor;

a first electrically conductive metal layer forming step of depositing a first electrically conductive metal layer by electroplating over said anchor metal layer;

a second electrically conductive metal layer forming step of depositing a second electrically conductive metal layer by electroplating over said first electrically conductive metal layer to form a composite lightweight plated wire material;

a heat treatment step of heat treating said composite lightweight plated wire material at about 150° C. to 250° C.; and a plastic working step of plastic working said composite lightweight plated wire material to have a desired size.

6. A method of fabricating the composite lightweight plated wire according to claim 5, comprising:

a degreasing step of removing oil from said outer surface of said conductor; and an oxide layer removing step of removing a natural oxide layer from said conductor.

* * * * *